United States Patent
Seddon et al.

(10) Patent No.: US 11,894,245 B2
(45) Date of Patent: Feb. 6, 2024

(54) NON-PLANAR SEMICONDUCTOR PACKAGING SYSTEMS AND RELATED METHODS

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Mesa, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 455 days.

(21) Appl. No.: 16/862,294

(22) Filed: Apr. 29, 2020

(65) Prior Publication Data
US 2021/0343555 A1 Nov. 4, 2021

(51) Int. Cl.
*H01L 21/67* (2006.01)
*B21D 11/10* (2006.01)
*H01L 21/02* (2006.01)

(52) U.S. Cl.
CPC ........ *H01L 21/67092* (2013.01); *B21D 11/10* (2013.01); *H01L 21/02035* (2013.01)

(58) Field of Classification Search
CPC ......... H01L 21/67092; H01L 21/02035; H01L 2221/68327; H01L 2221/6834; H01L 23/562; H01L 21/6835; B21D 11/10
See application file for complete search history.

(56) References Cited

U.S. PATENT DOCUMENTS

| | | | | |
|---|---|---|---|---|
| 8,852,391 | B2* | 10/2014 | McCutcheon | H01L 21/68721 156/941 |
| 2004/0142508 | A1* | 7/2004 | Brodsky | H01L 24/32 257/E29.022 |
| 2006/0148214 | A1* | 7/2006 | Knipe | H01L 21/02381 257/E21.123 |
| 2012/0104580 | A1* | 5/2012 | Feng | H01L 23/49575 257/E23.06 |
| 2016/0050748 | A1* | 2/2016 | Usami | H05K 1/0271 361/783 |
| 2017/0137589 | A1* | 5/2017 | Garza | B01D 71/32 |
| 2020/0058486 | A1* | 2/2020 | Dai | H01L 21/02016 |

* cited by examiner

*Primary Examiner* — S M Sohel Imtiaz
(74) *Attorney, Agent, or Firm* — Adam R. Stephenson, LTD.

(57) ABSTRACT

Implementations of a packaging system may include a wafer; and a curvature adjustment structure coupled thereto where the curvature adjustment structure may be configured to alter a curvature of a largest planar surface of the wafer.

20 Claims, 2 Drawing Sheets

NON-PLANAR SEMICONDUCTOR PACKAGING SYSTEMS AND RELATED METHODS

BACKGROUND

1. Technical Field

Aspects of this document relate generally to semiconductor packages. More specific implementations involve thinned semiconductor packages and methods of making such thinned semiconductor packages.

2. Background

Semiconductor package fabrication processes may involve many steps. In some processes a wafer receives one or more layers, such as electrically conductive layers. Electrically conductive layers may be used to provide electrical contact areas of individual semiconductor devices singulated from the wafer. Further, in some processes the overall size of the semiconductor package may designed to be minimized.

SUMMARY

Implementations of a packaging system may include a wafer; and a curvature adjustment structure coupled thereto where the curvature adjustment structure may be configured to alter a curvature of a largest planar surface of the wafer.

Implementations of packaging systems may include one, all, or any of the following:

The curvature adjustment structure may include a wheel and spoke structure.

The wheel and spoke structure may include at least two spokes.

The curvature adjustment structure may include two or more strips coupled across the largest planar surface of the wafer.

The curvature adjustment structure may include two or more intersecting strips comprised on the largest planar surface of the wafer.

At least a portion of the curvature adjustment structure may be included on an edge of the largest planar surface of the wafer.

At least a portion of the curvature adjustment structure may be included on an interior surface of the largest planar surface of the wafer.

Implementations of a packaging system may include a wafer and an organic material bonded to a largest planar surface of the wafer where the organic material may be configured to alter a curvature of the largest planar surface of the wafer.

Implementations of a packaging system may include one, all, or any of the following:

The organic material may include a wheel and spoke structure.

The wheel and spoke structure may include at least two spokes.

The organic material may include two or more strips coupled across the largest planar surface of the wafer.

The organic material may include two or more intersecting strips comprised on the largest planar surface of the wafer.

At least a portion of the organic compound may be included on an edge of the largest planar surface of the wafer.

At least a portion of the organic material may be included on an interior surface of the largest planar surface of the wafer.

Implementations of a packaging system may include a wafer and an organic material bonded to a largest planar surface of the wafer where the organic material may be configured to deflect at least a portion of the largest planar surface of the wafer.

Implementations of packaging systems may include one, all, or any of the following:

The organic material may include a wheel and spoke structure.

The organic material may include two or more strips coupled across the largest planar surface of the wafer.

The organic material may include two or more intersecting strips comprised on the largest planar surface of the wafer.

At least a portion of the organic material may be included on an edge of the largest planar surface of the wafer.

At least a portion of the organic material may be comprised on an interior surface of the largest planar surface of the wafer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended on-planar packaging system will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such non-planar packaging systems, and implementing components and methods, consistent with the intended operation and methods.

Figure 1:
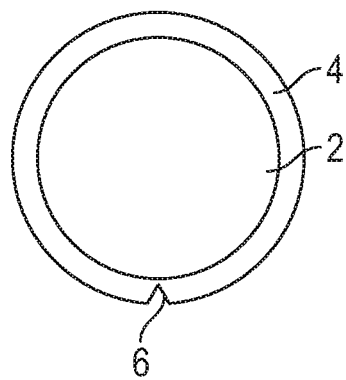
FIG. 1 illustrates a wafer with an implementation of a curvature adjustment structure.

Referring to FIG. 1, a thinned wafer with a curvature adjustment structure is illustrated. The curvature adjustment structure 4 is coupled to a semiconductor substrate 2 or semiconductor wafer around an edge of the substrate 2. The semiconductor substrate 2 includes a notch 6, as illustrated. In various implementations, the curvature adjustment structure 4 may not be coupled to the notch 6. In other implementations, however, the structure 4 may be coupled around or over the notch depending on the desired curvature effect desired. In various implementations, the semiconductor substrate 2 may be silicon. It is understood that where this disclosure refers to silicon, it could be any type of silicon including by non-limiting example, epitaxial silicon, silicon carbide, silicon on insulator, polysilicon, any combination thereof, or any other silicon-containing substrate material. Further, it is also understood that in various implementations a substrate other than a silicon-containing substrate may be used, such as, by non-limiting example, gallium arsenide, ruby, sapphire, a metal-containing substrate, or any other semiconductor substrate type. In various implementations, the semiconductor material, or planar semiconductor material, may be thinned from a thickness originally used during processing of the wafer through the various semiconductor process steps used to form semiconductor devices on/in the wafer. In various implementations, the techniques and structure disclosed in this document may be utilized with thin wafers, with no carrier employed to support the thin wafers.

In various implementations, a plurality of semiconductor devices may be partially/fully formed within the substrate. In particular implementations, a plurality of power semiconductor devices may be partially/fully formed including, by non-limiting example, MOSFETs, IGBTs, or any other power semiconductor device. In other implementations, however, a wide variety of other semiconductor devices may be included, by non-limiting examples, image sensors, diodes, transistors, or any other passive or active semiconductor device type. In various implementations, semiconductor wafers such as these may be used in large image sensors, such as, by non-limiting example, those used in magnetic resonance imaging (MRI) machines, light detection and ranging (LIDAR) systems, video recording systems, and any other image sensing system.

In various implementations, the curvature adjustment structure 4 may include an organic material like a mold compound. The mold compound may include, by non-limiting example, an epoxy, acrylic, resin, filler, pigment, additive, any combination thereof, or any other type of mold compound or protective covering capable of permanently holding a wafer or die in a curved position. In other implementations, however, a wide variety of other organic materials may be employed such as, by non-limiting example, a polyimide, a polymer, a tape, an adhesive tape, a film, a metal foil, a thick-film photoresist, or any other material capable of forming a layer on the semiconductor substrate capable of permanently holding the wafer or die in a curved position.

Figure 2:
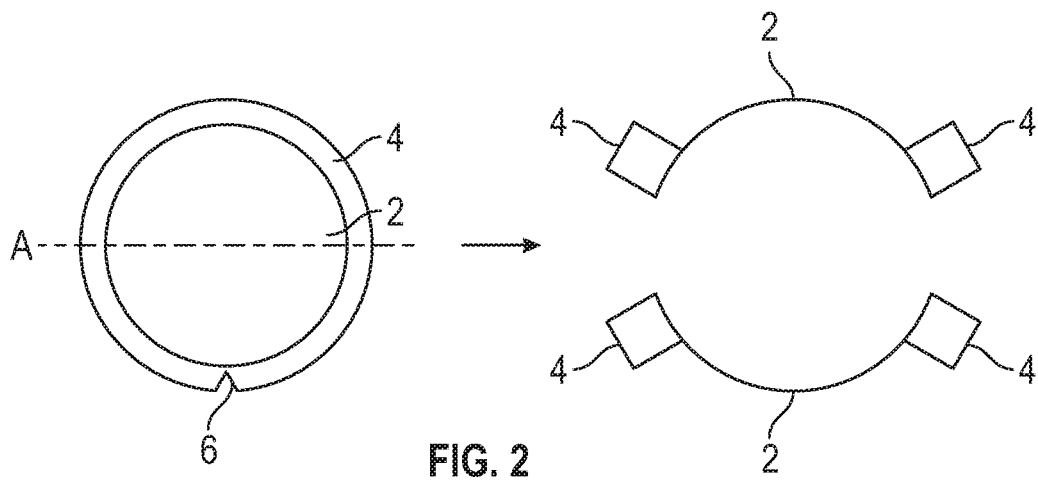
FIG. 2 illustrates a wafer and a cross-sectional side view of the wafer with an implementation of a curvature adjustment structure included on an edge of the wafer.

Referring to FIG. 2, a thinned wafer and a cross-sectional side view of the wafer with a curvature adjustment structure like that illustrated in FIG. 1 included on an edge of the wafer is illustrated. The curvature adjustment structure 4 is coupled to a semiconductor substrate 2 or semiconductor wafer and induces a desired curvature of the largest planar surface of the semiconductor substrate 2. In various implementations, the curvature may create a wide variety of shapes when viewed from the side of the semiconductor substrate. In the implementation illustrated in FIG. 2, the curvature forms an arc across the entire length of the wafer, forming a semicircle with a substantially constant cross section along the entire largest planar surface. A wide variety of other curved shapes may be formed, however, using the various curvature adjustment structures disclosed in this document, such as, by non-limiting example, conical, pyramidal, frustoconical, cylindrical, half-spherical, spherical, elliptical, circular, or any other closed shape projected into three dimensional space.

As illustrated in FIG. 2, the curvature adjustment structure 4 may be coupled on an edge, or alternatively around a perimeter, of the semiconductor substrate 2. As illustrated in the cross-sectional side views of the semiconductor substrate 2, the curvature adjustment structure 4 may be configured to alter a curvature of the semiconductor substrate 2, or a largest planar surface of the semiconductor substrate 2. In various implementations, the semiconductor substrate 2 may be curved downwardly through tensile forces exerted on the semiconductor substrate 2 through the curvature adjustment structure 45 or upwardly through compressive forces exerted on the semiconductor substrate 2 through the structure 4, as illustrated. In still other various implementations, areas or surfaces of the semiconductor substrate 2 may be curved to a certain degree, while other areas or surfaces of the semiconductor substrate 2 may be curved to a lesser degree, or to a greater degree than other areas or surfaces, creating localized deformities. This variation in curvature may be accomplished through, by non-limiting example, varying the placement position of the curvature adjustment structure on the largest planar surface of the semiconductor substrate 2, varying the local tensile or compressive force exerted on the largest planar surface of the semiconductor substrate 2 through changing a thickness of the structure, varying the local tensile or compressive force exerted through changing a material property of the material used in the structure, utilizing two or more layers of the same or different materials in the structure, and any other method or technique for varying the tensile or compressive force applied to the largest planar surface of the substrate.

In various implementations, in an implementation of a method of manufacturing a curvature adjustment structure on a thinned planar semiconductor substrate material (wafer), following formation of one or more semiconductor devices on/in the wafer, a second side of the wafer opposite the side where the device are located is thinned through, by non-limiting example, back grinding, grinding, polishing, lapping, any combination thereof, and any other method for thinning a semiconductor substrate. The curvature adjustment structure is then applied to the first side of the semiconductor substrate around a perimeter or other location on the substrate. In particular implementations, the material may be a mold compound. The mold compound may be applied using, by non-limiting example, a liquid dispensing technique, a transfer molding technique, a vacuum molding technique, a glob top molding technique, a compression molding technique, or any other method of applying a polymeric material to the end of a semiconductor substrate. In other implementations the material may be, by non-limiting example, a polyimide, a polymer, a tape, an adhesive tape, a film, a metal foil, a thick-film photoresist, or any other material. The method of applying the material may depend on the nature of the material used. For example, where a tape is used, the tape may be cut into a strip and then applied from one end or a center while deflecting the semiconductor substrate in the desired direction while continuing to apply the tape, eventually holding the semiconductor substrate in the desired deflected position. Where other materials are used, the material may be initially applied, and then heated or cured to cause the material to apply a compressive or tensile force to the semiconductor substrate. A wide variety of method implementations may be employed in various implementations of materials using the principles disclosed herein. Where a mold compound is used, the mold compound may initially be formed in a B stage into a curvature adjustment structure that applies the desired tensile/compressive force and then cured to permanently retain the semiconductor substrate into position. In some other mold compounds or other material types, when formed into a curvature adjustment structure, the material may shrink or expand to adjust, alter, or deflect the curvature of the semiconductor substrate over time or during a short term curing process. The curing process may be, by non-limiting example, heating, cooling, temperature ramping up, temperature ramping down, exposing to light, or any other method of curing a resin, epoxy, or other material.

Figure 3:
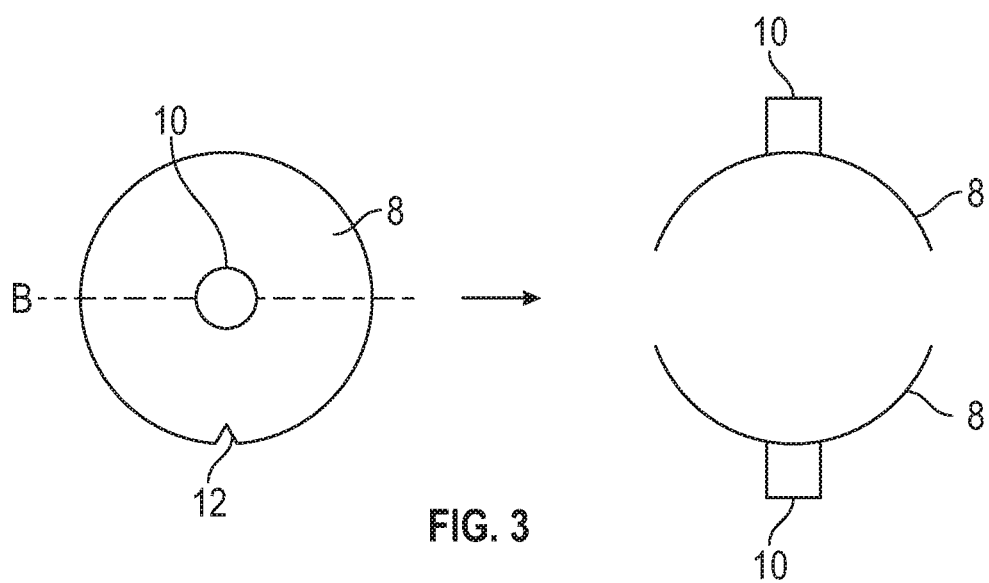
FIG. 3 illustrates a wafer and a cross-sectional side view of the wafer with an implementation of a curvature adjustment structure included on an interior of the wafer.

Referring to FIG. 3, a wafer and a cross-sectional side view of the wafer with a curvature adjustment structure included on an interior part of the largest planar surface of the wafer is illustrated. The curvature adjustment structure 10 is coupled to a semiconductor substrate 8 or semiconductor wafer at an interior position on the largest planar surface. The semiconductor substrate 8 may include a notch 12, as illustrated. As illustrated in the cross-sectional side views of the semiconductor substrate 8, the curvature adjustment structure 10 is configured to alter a curvature of the semiconductor substrate 8, or a largest planar surface of the semiconductor substrate 8 at the interior position. In various implementations, the semiconductor substrate 8 may be curved downwardly through tensile stress being applied to the substrate or upwardly through compressive stress being applied to the substrate 8. As illustrated in the side view, the stress is being applied through a curvature adjustment structure that forms a circle located in the center of the wafer, which may be made of any material disclosed in this document. In other various implementations, the semiconductor substrate 8 may be uniformly curved from edge to edge, though any of the other shapes disclosed in this document may be created in particular implementation. In still other various implementations, areas or surfaces of the semiconductor substrate 8 may be curved to a certain degree, while other areas or surfaces of the semiconductor substrate 8 may be curved to a lesser degree, or to a greater degree than other areas or surfaces, creating localized regions of curvature.

Figure 4:
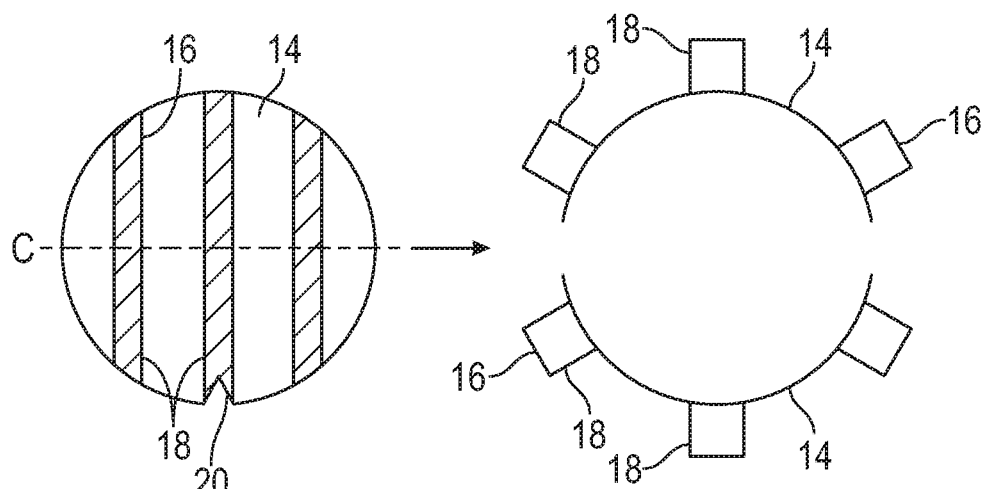
FIG. 4 illustrates a wafer and a cross-sectional side view of the wafer with an implementation of a curvature adjustment structure with two or more strips.

Referring to FIG. 4, a wafer and a cross-sectional side view of the wafer with a curvature adjustment structure composed of three strips of material is illustrated. The curvature adjustment structure 16 is coupled along three different points of a larges planar surface of a semiconductor substrate 14 or semiconductor wafer, as illustrated. The semiconductor substrate 14 may include a notch 20 (or one or more flats), as illustrated. In various implementations, the curvature adjustment structure 16 may not be coupled to or over the notch 20. In various implementations, the curvature adjustment structure 16 may include any of the material types disclosed in this document.

As illustrated in the cross-sectional side views of the semiconductor substrate 14, the curvature adjustment structure 16 is configured to alter a curvature of the semiconductor substrate 14, or a largest planar surface of the semiconductor substrate 14. In various implementations, the semiconductor substrate 14 may be curved in a desired direction through application of tensile or compressive stresses to the largest planar surface of the substrate 14. Any of the various uniform curved shapes or other shapes disclosed in this document may be created using the structure 16. While three strips of material are illustrated in the curvature adjustment structure 16, in other implementations, one, two, or more than three strips may be employed. Also, in various implementations, portions or all of the strips may be angled or curved toward or away from each other when placed/formed/coupled on the largest planar surface of the substrate 14. In this way, the placement and angling/curvature of the one or more strips may be used to apply the desired degree of compressive or tensile stress to the largest planar surface.

Figure 5:
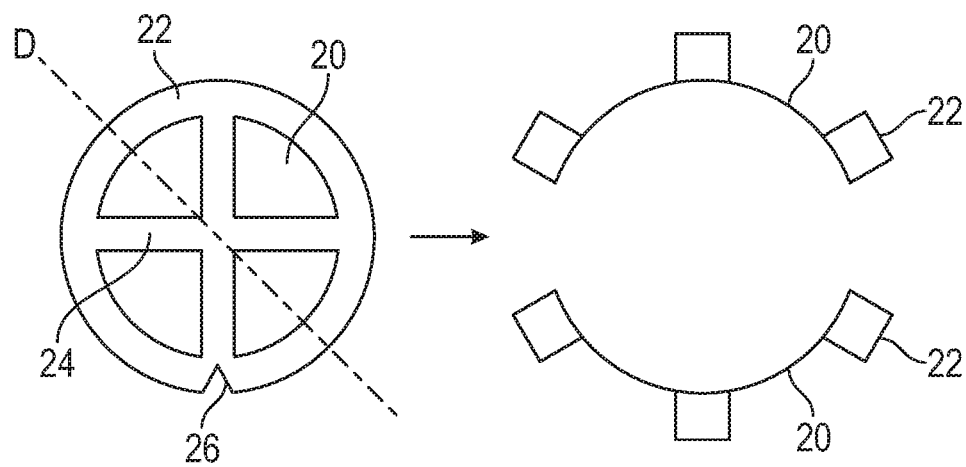
FIG. 5 illustrates a wafer and a cross-sectional side view of the wafer with an implementation of a curvature adjustment structure with a wheel and spoke structure.

Referring to FIG. 5, a wafer and a cross-sectional side view of the wafer with a curvature adjustment structure with a wheel and spoke structure is illustrated. The curvature adjustment structure 22 is coupled to a semiconductor substrate 20 or semiconductor wafer, as illustrated. As illustrated, the curvature adjustment structure 22 form a wheel and spoke structure on the semiconductor substrate 20 that has a central hub where the spokes meet. In other implementations, however, no central hub may be formed and the spokes may not actually touch each other, but instead an opening where no material is coupled may be used in various implementations. As illustrated, the wheel and spoke structure includes four spokes 24. In other implementations, two, three, or more spokes may be utilized. The semiconductor substrate 20 may include a notch 26, as illustrated. In various implementations, the curvature adjustment structure 22 may not be coupled to the notch 26. In various implementations, the curvature adjustment structure 22 may include any of the material disclosed in this document.

As illustrated in the cross-sectional side views of the semiconductor substrate 20, the curvature adjustment structure 22 is configured to alter a curvature of the semiconductor substrate 20, or a largest planar surface of the semiconductor substrate 20. In various implementations, the semiconductor substrate 20 may be curved in response to the compressive or tensile stress applied by the structure of the curvature adjustment structure 22, as illustrated. In other various implementations, the semiconductor substrate 20 may take any of the shapes disclosed in this document through the curvature adjustment structure 22.

Figure 6:
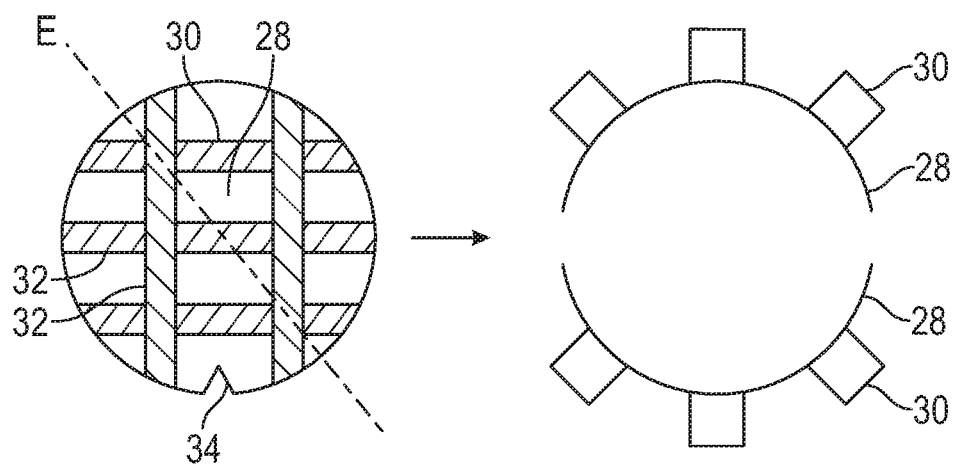
FIG. 6 illustrates a wafer and a cross-sectional side view of the wafer with an implementation of a curvature adjustment structure with two or more intersecting strips.

Referring to FIG. 6, a wafer and a cross-sectional side view of the wafer with a curvature adjustment structure with two or more intersecting strips is illustrated. The curvature adjustment structure 30 is coupled to the largest planar surface of a semiconductor substrate 28 or semiconductor wafer, as illustrated. As illustrated, the curvature adjustment structure 30 includes five intersecting strips 32 across the semiconductor substrate 28. The semiconductor substrate 28 may include a notch 34, as illustrated. In various implementations, the curvature adjustment structure 30 may not be coupled to the notch 34. While the various strips are illustrated at intersecting at substantially right angles one to each other and being substantially parallel with respect to each other, as in the curvature adjustment structure illustrated in FIG. 5, the strips may be angled or curved relative to each other when coupled to the largest planar surface of the substrate 28 to generate the desired compressive or tensile stress. In various implementations, the curvature adjustment structure 30 may include any of the materials disclosed in this document.

As illustrated in the cross-sectional side views of the semiconductor substrate 28, the curvature adjustment structure 30 is configured to alter a curvature of the semiconductor substrate 28 while not being coupled along the perimeter of the substrate 28. In various implementations, the semiconductor substrate 28 may be curved downward or upward through compressive or tensile stresses of the curvature adjustment structure 30. In other various implementations, the semiconductor substrate 28 may take on any of the shapes disclosed in this document.

In various implementations, the curvature adjustment structure may be applied prior to or after thinning of the wafer/semiconductor material. In various implementations, at the time the support structure is applied, it may be applied in its entirety, or may be applied in portions. In various implementations, the various curvature adjustment structures disclosed herein may include one or more layers of material. In these implementations, the one or more layers may include different types or the same types of material. In some implementations, one of the one or more layers of material may be temporarily applied, being removable from the other layers of material at a particular part of subsequent packaging steps. Any of a wide variety of method implementations of a method of forming a curvature adjustment structure on a semiconductor substrate/wafer may be employed in various implementations.

In places where the description above refers to particular implementations of non-planar packaging systems and implementing components, sub-components, methods and sub-methods, it should be readily apparent that a number of modifications may be made without departing from the spirit thereof and that these implementations, implementing components, sub-components, methods and sub-methods may be applied to other non-planar packaging systems.

What is claimed is:

1. A packaging system comprising:
a wafer; and
a curvature adjustment structure permanently coupled thereto;
wherein the curvature adjustment structure is configured to induce a curvature of a largest planar surface of the wafer.

2. The packaging system of claim 1, wherein the curvature adjustment structure comprises a wheel and spoke structure.

3. The packaging system of claim 2, wherein the wheel and spoke structure comprises at least two spokes.

4. The packaging system of claim 1, wherein the curvature adjustment structure comprises two or more strips coupled across the largest planar surface of the wafer.

5. The packaging system of claim 1, wherein the curvature adjustment structure comprises two or more intersecting strips comprised on the largest planar surface of the wafer.

6. The packaging system of claim 1, wherein at least a portion of the curvature adjustment structure is positioned on an edge of the largest planar surface of the wafer.

7. The packaging system of claim 1, wherein at least a portion of the curvature adjustment structure is comprised on an interior surface of the largest planar surface of the wafer.

8. A packaging system comprising:
a wafer; and
an organic material permanently bonded to a largest planar surface of the wafer;
wherein the organic material is configured to increase a curvature of the largest planar surface of the wafer.

9. The packaging system of claim 8, wherein the organic material comprises a wheel and spoke structure.

10. The packaging system of claim 9, wherein the wheel and spoke structure comprises at least two spokes.

11. The packaging system of claim 8, wherein the organic material comprises two or more strips coupled across the largest planar surface of the wafer.

12. The packaging system of claim 8, wherein the organic material comprises two or more intersecting strips comprised on the largest planar surface of the wafer.

13. The packaging system of claim 8, wherein at least a portion of the organic material is positioned on an edge of the largest planar surface of the wafer.

14. The packaging system of claim 8, wherein at least a portion of the organic material is comprised on an interior surface of the largest planar surface of the wafer.

15. A packaging system comprising:
a wafer; and
an organic material permanently bonded to a largest planar surface of the wafer;
wherein the organic material is configured to deflect at least a portion of the largest planar surface of the wafer and increase curvature in the largest planar surface of the wafer.

16. The packaging system of claim 15, wherein the organic material comprises a wheel and spoke structure.

17. The packaging system of claim 15, wherein the organic material comprises two or more strips coupled across the largest planar surface of the wafer.

18. The packaging system of claim 15, wherein the organic material comprises two or more intersecting strips comprised on the largest planar surface of the wafer.

19. The packaging system of claim 15, wherein at least a portion of the organic material is positioned on an edge of the largest planar surface of the wafer.

20. The packaging system of claim 15, wherein at least a portion of the organic material is comprised on an interior surface of the largest planar surface of the wafer.

\* \* \* \* \*